United States Patent
Racanelli et al.

[11] Patent Number: 5,532,175
[45] Date of Patent: Jul. 2, 1996

[54] METHOD OF ADJUSTING A THRESHOLD VOLTAGE FOR A SEMICONDUCTOR DEVICE FABRICATED ON A SEMICONDUCTOR ON INSULATOR SUBSTRATE

[75] Inventors: Marco Racanelli, Phoenix; Bor-Yuan C. Hwang, Tempe; Juergen Foerstner, Mesa; Wen-Ling M. Huang, Phoenix, all of Ariz.

[73] Assignee: Motorola, Inc., Schaumburg, Ill.

[21] Appl. No.: 423,614

[22] Filed: Apr. 17, 1995

[51] Int. Cl.[6] ............... H01L 21/226; H01L 21/335
[52] U.S. Cl. .................. 437/29; 437/44; 437/45; 148/DIG. 150
[58] Field of Search ...................... 437/29, 44, 45, 437/41 CS; 257/391, 402; 148/DIG. 150

[56] References Cited

U.S. PATENT DOCUMENTS

| | | | |
|---|---|---|---|
| 4,649,629 | 3/1987 | Miller et al. | 437/45 |
| 4,845,047 | 7/1989 | Holloway et al. | 437/45 |
| 4,948,745 | 8/1990 | Pfiester et al. | 437/41 |
| 5,028,552 | 7/1991 | Ushika | 437/41 |
| 5,081,052 | 1/1992 | Kobayashi et al. | 437/29 |
| 5,091,328 | 2/1992 | Miller | 437/52 |
| 5,248,627 | 9/1993 | Williams | 437/45 |

*Primary Examiner*—T. N. Quach
*Attorney, Agent, or Firm*—George C. Chen

[57] ABSTRACT

A method of adjusting a threshold voltage for a semiconductor device on a semiconductor on insulator substrate includes performing a threshold voltage adjustment implant (25) after formation of a gate structure (16) to reduce the diffusion of implanted dopant (26). Reducing dopant diffusion eliminates the narrow channel effect which degrades device performance. Implanting the dopant (26) after formation of the gate structure (16) simplifies processing of semiconductor device (28) by eliminating a photolithography step which is accomplished by utilizing photoresist (21) used for a source and drain implant (22).

20 Claims, 2 Drawing Sheets

METHOD OF ADJUSTING A THRESHOLD VOLTAGE FOR A SEMICONDUCTOR DEVICE FABRICATED ON A SEMICONDUCTOR ON INSULATOR SUBSTRATE

BACKGROUND OF THE INVENTION

This invention relates, in general, to a method of manufacturing a semiconductor device, and more particularly, to a method of adjusting a threshold voltage during the manufacturing of a semiconductor device on a semiconductor on insulator substrate for low power applications.

Silicon on insulator or SOI technology provides several advantages over conventional bulk silicon technology for RF, low power, and high performance applications. These advantages include reduced processing steps, CMOS circuit latchup elimination, higher transistor density, parasitic capacitance reduction for increased speed, improved device isolation, and superior radiation hardness.

In SOI technology, the threshold voltage of a transistor is of critical importance and is controlled by several factors including the doping level in the channel of the FET. Since diffusion well isolation is not required for SOI devices, the doping level is controlled by implanting a dopant near the beginning of the fabrication process after isolating active regions of the SOI substrate. For complementary SOI technology, the threshold voltage adjustment implant for n-channel devices uses a photoresist mask to block the implant from the active regions of p-channel devices and vice versa. The implant is performed through a sacrificial oxide layer on the surface of the active region of the SOI substrate where the oxide layer serves as an implant screen to reduce implant channeling.

The implanted dopant diffuses during subsequent high temperature processing steps used to form a gate structure on the active region. For SOI substrates, the dopant diffuses and segregates into the buried oxide insulator which produces undesirable FET characteristics including higher leakage currents resulting from a lightly doped back interface between the silicon layer and the underlying oxide insulator. The dopant diffusion and segregation also produce a narrow channel effect where the threshold voltage moves in a positive direction as the device width decreases. The device degradation resulting from the narrow channel effect requires the design and fabrication of wider devices for a given threshold voltage and a fixed implant dose. However, larger devices decrease the density of the circuit layout and increase the power consumed by the circuit which is not compatible with low power applications.

To reduce dopant diffusion and its associated SOI device degradation, the threshold voltage adjustment implant can be performed through the gate oxide instead of through a sacrificial implant screen to reduce channeling. Although this process eliminates the high temperature gate oxide formation step which promotes dopant diffusion, this process introduces an additional problem of gate oxide integrity since the exposed gate oxide can be damaged or contaminated. Also, after the threshold voltage adjustment implant a high temperature oxidation after gate etch to repair the gate structure and a high temperature densification anneal after spacer formation still remain.

To protect gate oxide integrity, a portion of the gate polysilicon layer can be deposited on the gate oxide prior to the threshold adjustment implant, and the remainder of the gate can be deposited after the implant. However, dopant diffusion still occurs since two high temperature oxidations still remain after the threshold voltage adjustment implant. In addition to the increased complexity and cost of a split-gate deposition process, a gate depletion phenomenon can worsen performance if an oxide layer exists between the two gate polysilicon layers and serves as a diffusion barrier during gate doping.

Another proposed solution to the dopant diffusion issue is to reduce the temperature of the post-implant high temperature processing. However, oxide enhanced diffusion of dopants is significant even at the reduced temperatures, and the reduced temperature steps are more costly and complicated than conventional high temperature steps.

Accordingly, a need exists for adjusting the threshold voltage of a semiconductor device fabricated on a semiconductor on insulator substrate. While reducing dopant redistribution after performing the threshold voltage adjustment implant, the method should maintain the advantages and improve the processing simplicity of SOI technology.

DETAILED DESCRIPTION OF THE DRAWINGS

Figure 1:
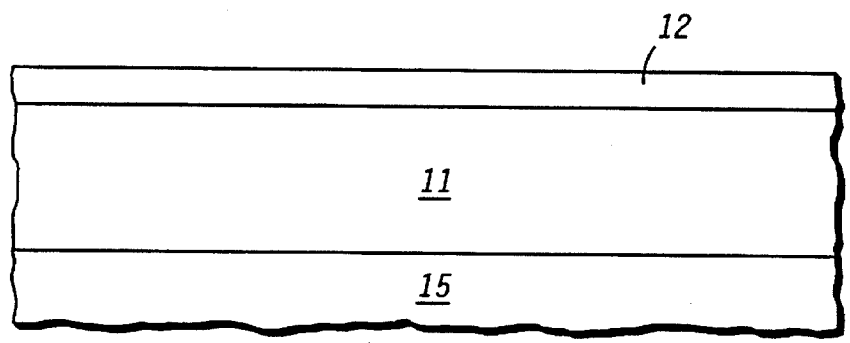
FIG. 1 is a cross-sectional view illustrating a silicon on insulator or SOI substrate.

Silicon layer 12 on oxide layer 11 form silicon on insulator substrate 10 as depicted in a cross-sectional view of FIG. 1. Silicon on insulator or SOI substrate 10 is formed using conventional processes known in the art including Separation by IMplanted OXygen (SIMOX) and wafer bonding. The thickness of silicon layer 12 is approximately 100 to 5000 Å. A semiconductor device is built on silicon layer 12 and not on silicon layer 15. Silicon layer 12 is kept thin for high speed, low power applications. Oxide layer 11 is between silicon layer 12 and silicon layer 15. The thickness of oxide layer 11 ranges approximately from 1 to 4 kÅ for SIMOX and from 0.1 to 4 microns for wafer bonding.

Figure 2:
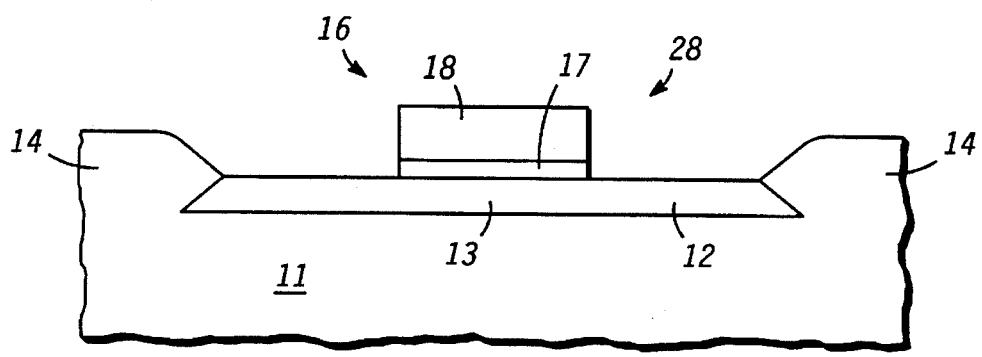
FIG. 2 is a cross-sectional view illustrating a gate structure on an SOI substrate.

Silicon layer 12 is isolated into active region 13 by oxide region 14 as shown in FIG. 2. LOCal Oxidation of Silicon (LOCOS) or other conventional oxidation techniques known in the art are used to provide oxide region 14 for patterning silicon layer 12 into active region 13. As an example of a LOCOS process, a silicon nitride layer (not shown) can be deposited on a silicon dioxide layer (not shown) which is previously thermally grown on silicon layer 12. The silicon nitride layer is patterned such that the silicon nitride layer remains only on active region 13. The exposed portions of silicon layer 12 are thermally oxidized into oxide region 14, and the patterned silicon nitride layer and silicon dioxide layer are selectively etched off of active region 13 of substrate 10.

After isolation, gate structure 16 which includes insulator 17 and conductor 18 is formed using conventional semiconductor gate processing techniques known in the art. For instance, 50 to 400 Å of gate oxide or silicon dioxide 17 is thermally grown on active region 13, and 1 to 5 kÅ of polycrystalline silicon 18 is deposited on gate oxide 17. The height of deposited polycrystalline silicon 18 is the desired final height of gate structure 16 for semiconductor device 28. Patterned photoresist on polycrystalline silicon 18 is used as an etch mask in forming gate structure 16. In FIG. 2, the patterned photoresist has been removed.

Figure 3:
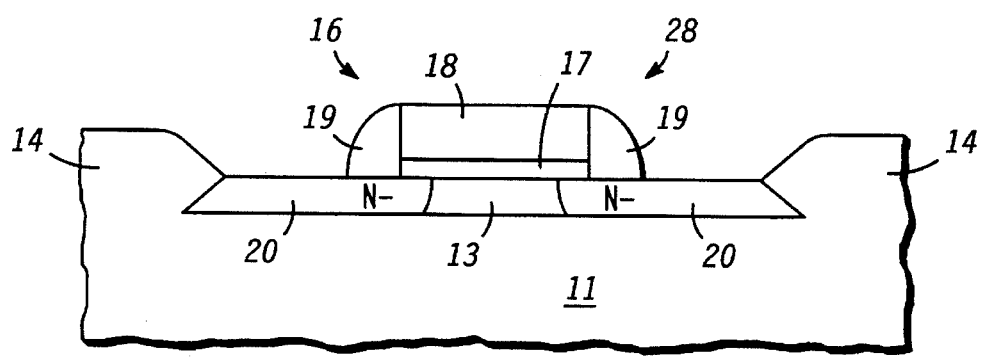
FIG. 3 is a cross-sectional view illustrating a lightly doped drain region and sidewalls around a gate structure of an n-channel MOSFET on an SOI substrate.

After formation of gate structure 16, a conventional self-aligning lightly doped drain (LDD) implant is performed to form lightly doped drain region 20 as shown in FIG. 3. For n-channel semiconductor device 28, the LDD implant uses an n-type dopant. For a channel of a different conductivity, the LDD implant uses a dopant of the other conductivity.

As conventionally performed in an LDD implant, the implant energy of the LDD implant is sufficient to penetrate exposed active region 13 but not sufficient to penetrate active region 13 under gate structure 16. Polycrystalline silicon 18 of gate structure 16 serves as an implant mask to block the LDD implant. In LDD region 20, the implant energy of the LDD implant controls the peak concentration depth. If the LDD implant is implanted into oxide layer 11, the dopant is not active due to isolation provided by oxide layer 11. An additional implant can be used to optimize the dopant profile of LDD region 20. Lightly doped drain region or LDD region 20 reduces the electric field of semiconductor device 28 by grading the doping level of active region 13. This doping level gradation is discussed further in FIG. 4.

Although not shown in FIG. 3, patterned photoresist is used to prevent self-aligning LDD implant from penetrating other active regions which do not require the implant. The photoresist covered active regions include those used for semiconductor devices with a channel of a different conductivity type compared to that of semiconductor device 28. The patterned photoresist is removed after performing the LDD implant.

After formation of LDD region 20, sidewall 19 is formed using conventional semiconductor sidewall processing as known in the art. As an example, silicon dioxide is deposited on gate structure 16, active region 13, and oxide region 14. As shown in FIG. 3, the deposited silicon dioxide is anisotropically etched to form sidewall or spacer 19 of a similar height as gate structure 16.

Figure 4:
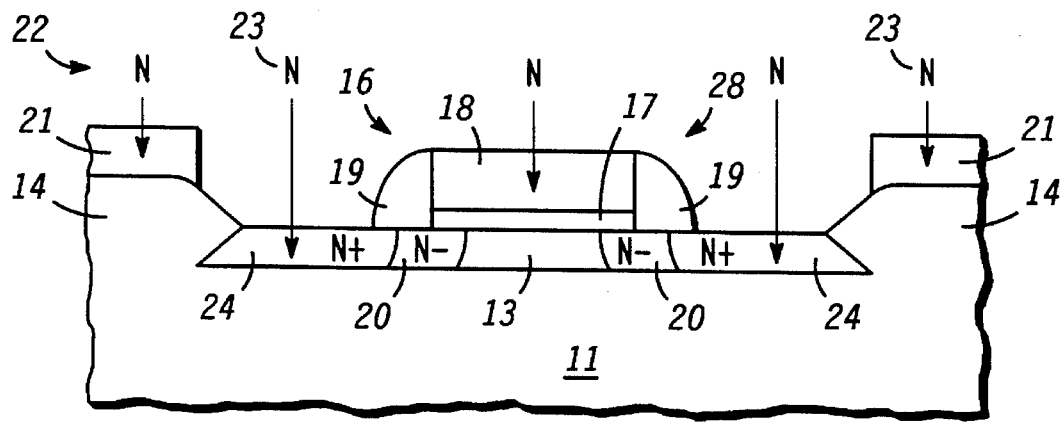
FIG. 4 is a cross-sectional view illustrating a source and drain implant using an n-type dopant for an n-channel MOSFET on an SOI substrate.

FIG. 4 depicts self-aligning implant 22 performed after formation of gate structure 16 and oxide spacer 19. The self-alignment of implant 22 is important for small geometry devices. Implant 22 introduces dopant 23 into active region 13 to overlap LDD region 20 to form source and drain region 24. To form lateral semiconductor device 28 with an n-channel, dopant 23 is a dopant having an n-type conductivity such as phosphorous, arsenic, or the like. Dopant 23 is of a different conductivity type to form semiconductor device or MOSFET 28 with a channel of the different conductivity type.

Patterned photoresist 21 is used to cover other active regions which do not require self-aligning implant 22. The photoresist covered active regions include those used for semiconductor devices with a channel of a different conductivity type compared to that of semiconductor device 28.

As conventionally performed in semiconductor source and drain formation, the implant energy of dopant 23 during implant 22 is sufficient to penetrate active region 13 in source and drain region 24 but not sufficient to penetrate active region 13 under gate structure 16. Polycrystalline silicon 18 of gate structure 16 serves as an implant mask to block implant 22. In source and drain region 24, the implant energy of dopant 23 controls the depth of the peak concentration of implant 22. If dopant 23 is implanted into oxide layer 11, dopant 23 is not active due to isolation provided by oxide layer 11. An additional implant can be used to optimize the dopant profile of source and drain region 24.

Depending upon the height of spacer 19, portions of spacer 19 will also stop implant 22 from penetrating active region 13 under spacer 19. Outer portions of spacer 19, which are a lower height and slope down to active region 13, are not thick enough to stop implant 22 from penetrating active region 13. Also, due to wafer tilt during implantation for implant channeling reduction, implant 22 may not be orthogonal to the surface of active region 13, and implant 22 can slant under spacer 19. Implant straggle will also disperse dopant 23 under spacer 19. Therefore, as depicted in FIG. 4, a portion of source and drain region 24 will exist underneath a portion of spacer 19. For similar reasons, a portion of LDD region 20 exists underneath a portion of gate structure 16 since the LDD implant is performed prior to the formation of spacer 19.

Spacer 19 is not required for self-aligning implant 22. However, for high speed applications, gate structure 16 will be small to provide a short gate length. Without spacer 19, the portion of active region 13 protected by gate structure 16 is small, and due to implant straggle and wafer tilt during implant 22, active region 13 can be entirely converted into source and drain region 24. Therefore, it is preferred to form spacer 19 on active region 13 prior to performing implant 22.

A portion of LDD region 20 is converted into source and drain region 24 by implant 22. As shown in FIG. 4, spacer 19 is used to block implant 22 from completely overlapping LDD region 20. Since the dose of implant 22 is higher than the dose of the LDD implant, the doping concentration of source and drain region 24 is higher than the doping concentration of LDD region 20, and the doping concentration of LDD region does not significantly affect the doping concentration of source and drain region 24. Source and drain region 24 has a higher n-type doping concentration as designated by the label "N+", and LDD region 20 has a lower n-type doping concentration as designated by the label "N−". A portion of the original LDD region exists to provide a graded doping concentration to reduce the electric field in active region 13 to increase the breakdown voltage of semiconductor device 28. LDD region 20 and source and drain region 24 are of the same conductivity type.

During conventional salicide processes, spacer 19 is also used to provide separation between the gate, source, and drain contacts.

Figure 5:
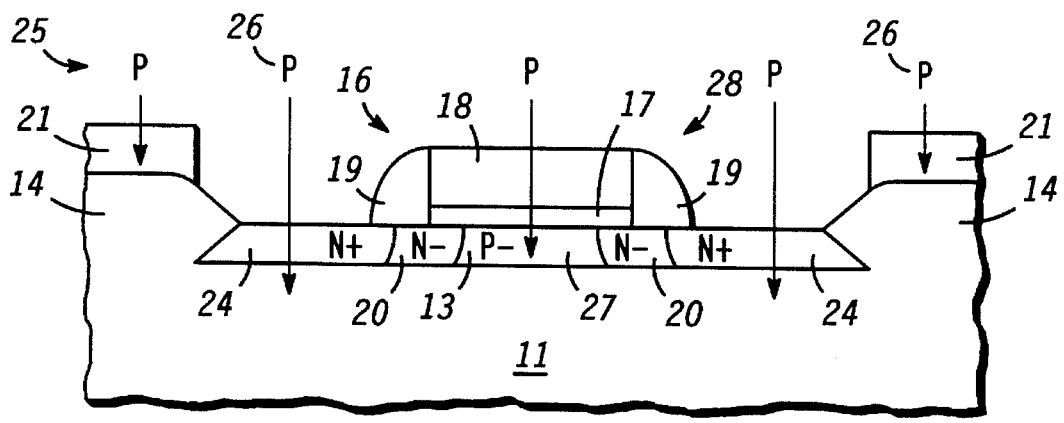
FIG. 5 is a cross-sectional view illustrating a threshold voltage adjustment implant using a p-type dopant for an n-channel MOSFET on an SOI substrate.

FIG. 5 illustrates threshold voltage adjustment implant 25 which introduces dopant 26 into active region 13 to form channel region 27. To form lateral semiconductor device 28 with an n-channel, implanted dopant 26 is a dopant having a p-type conductivity such as boron. Dopant 26 is of a different conductivity type to form semiconductor device 28 with a channel of the different conductivity type. A p-type dopant is implanted into an n-channel device to adjust the threshold voltage in a positive direction. Similarly, an n-type dopant, such as phosphorous, can be implanted into an n-channel device to adjust the threshold voltage in a negative direction. An additional implant can be used to optimize the dopant profile of channel region 27.

Patterned photoresist 21 is used to cover other active regions which do not require implant 25. The photoresist covered active regions include those used for semiconductor devices with a channel of a different conductivity type compared to that of semiconductor device 28. Patterned photoresist 21 is the same photoresist used for implant 22 to form source and drain region 24.

In conventional silicon processing, threshold voltage adjustment implant 25 is performed prior to formation of gate structure 16 and spacer 19. Therefore, implant 25 uses a separate photoresist mask from implant 22. In the present invention, the photoresist mask used exclusively for implant 25 is eliminated since the photoresist mask for implant 22 is also used for implant 25.

Since the same photoresist pattern is used for implants 22 and 25, source and drain region 24 will be exposed to threshold voltage adjustment implant 25. Although implant 25 is a different conductivity type than implant 22, the implant dose of implant 22 is approximately 3 orders of magnitude higher than the implant dose of implant 25. The difference in the concentration magnitude is shown in FIG. 5 by using the label of "N+" for the heavily doped n-type area of source and drain region 24 and by using the label of "P−" for the lightly doped p-type area of channel region 27. Therefore, although p-type threshold voltage adjustment implant 25 is implanted into n-type source and drain region 24, the lower concentration of p-type dopant 26 does not significantly affect the higher concentration of n-type dopant 23. A similar effect is observed if threshold voltage adjustment implant 25 uses an n-type dopant.

Implant 25 is performed at an implant dose of approximately $2 \times 10^{11}$ to $8 \times 10^{13}$ atoms/cm$^2$ and an implant energy of approximately 50 to 400 keV. The implant acceleration energy of dopant or boron 26 during implant 25 is sufficient to penetrate active region 13 under gate structure 16. As known in the art, a lower implant energy is required to implant a lighter dopant to a similar depth as a heavier dopant, and a lower implant energy reduces implant straggle compared to a higher implant energy. Since implant 25 passes through gate structure 16, dopant 26 of implant 25 should be of a size which does not significantly damage gate structure 16. Therefore, a dopant with a small nuclear radius or small atomic mass, such as boron, is preferred.

The threshold voltage adjustment implant depicted in FIG. 5 is not suitable for semiconductor processing on bulk silicon wafers since higher implant energy increases implant straggle and channeling which produces a wider implant profile which produces a deeper semiconductor device channel. However, high speed, low power devices require thin channels. For SOI devices, the depth of channel region 27 is determined by the thickness of silicon layer 12 since implanted dopant residing in oxide layer 11 is inactive and does not contribute toward current conduction. Therefore, the use of a high energy implant to form SOI channel region 27 does not produce problems with increased channel depth due to implant straggle and channeling associated with bulk silicon processing.

Gate structure 16 is above channel region 27 but not above source and drain region 24. If the implant stopping ability of gate structure 16 is similar to that of substrate 10, the peak concentration of threshold voltage adjustment implant 25 resides closer to the surface of substrate 10 in channel region 27 under gate structure 16 compared to source and drain region 24 which is not under gate structure 16. Therefore, p-type dopant 26 resides below n-type source and drain region 24. For SOI substrate 10, dopant 26 below source and drain region 24 is inactive due to oxide layer 11. However, if substrate 10 were a bulk silicon substrate, the threshold voltage adjustment implant depicted in FIG. 5 would create a higher concentration p-type region below n-type source and drain regions and would increase source and drain junction capacitances. This increase in p-n junction capacitance degrades speed and power performance in bulk silicon devices. While some high power, deep junction vertical devices may not have this problem, low power SOI devices will definitely not have this problem. Therefore, although not compatible with bulk silicon devices, threshold voltage adjustment implant 25 is suitable for fabricating SOI devices.

Implants 22 and 25 are subsequently annealed to activate implanted dopants 23 and 26, respectively. The high temperature anneal or rapid thermal anneal is of a short time duration to prevent dopant diffusion associated with long diffusion anneals and to eliminate problems associated with dopant diffusion.

Other variations within the scope of the present invention include using different elements for silicon layer 12 and oxide layer 11 of SOI substrate 10. For instance, other insulators including sapphire can be substituted for oxide layer 11 to form silicon on sapphire substrate 10. Alternatively, other semiconductors such as gallium arsenide or indium phosphide can be substituted for silicon layer 12 to form semiconductor on insulator (SOI) substrate 10. Additional variations of the present invention include interchanging the processing order of source and drain implant 22 and threshold voltage adjustment implant 25. Yet another variation uses nitride to form spacer 19. Furthermore, the semiconductor manufacturing process embodied in the present invention to produce semiconductor device 28 can be used to produce MESFET, CMOS, and BiCMOS devices.

Therefore, in accordance with the present invention, it is apparent there has been provided an improved process for adjusting the threshold voltage for a semiconductor device fabricated on a semiconductor on insulator substrate which overcomes the disadvantages of the prior art. The present invention reduces threshold voltage adjustment dopant diffusion resulting from subsequent high temperature processing by performing the threshold voltage adjustment implant after the high temperature oxidation steps. Reducing dopant diffusion eliminates the detrimental narrow channel effect. The present invention also simplifies the processing of semiconductor on insulator devices by eliminating one photolithography step by using a common photoresist layer for the threshold voltage adjustment implant and the source and drain implant.

We claim:

1. A method of adjusting a threshold voltage for a semiconductor device with a channel of a first conductivity type fabricated on a semiconductor on insulator (SOI) substrate, the method comprising: providing the semiconductor on insulator substrate; isolating an active region on the semiconductor on insulator substrate; forming a gate structure on the active region; forming a patterned photoresist layer on the semiconductor on insulator substrate while leaving the active region exposed; implanting a first dopant of the first conductivity type into the active region, wherein the first dopant is implanted with a first implant energy and with a first implant dose, wherein the gate structure prevents the first dopant from penetrating the active region under the gate structure during implanting of the first dopant, and wherein the first dopant does not pass through the patterned photoresist layer during implanting of the first dopant; implanting a second dopant of a second conductivity type into the active region, wherein the second dopant is implanted with a second implant energy and with a second implant dose, wherein the second dopant penetrates the active region under the gate structure by passing through the gate structure during implanting of the second dopant, wherein the second dopant does not pass through the patterned photoresist layer during implanting of the second dopant, and wherein the patterned photoresist layer used to block the first dopant is also used to block the second dopant; removing the patterned photoresist layer; and annealing the first dopant and the second dopant.

2. The method of claim 1 further including implanting the second dopant with an implant energy of about 50 keV to 400 keV.

3. The method of claim 2 further including implanting the second dopant with an implant dose of about $2 \times 10^{11}$ atoms/$cm^2$ to $8 \times 10^{13}$ atoms/$cm^2$.

4. The method of claim 3 further including implanting boron for the second dopant.

5. The method of claim 1 further including implanting at a lower implant energy for the first implant energy of the first dopant than for the second implant energy of the second dopant.

6. The method of claim 5 further including implanting at a higher implant dose for the first implant dose of the first dopant than for the second implant dose of the second dopant.

7. The method of claim 1 wherein forming the gate structure includes providing a conductor on an insulator wherein the conductor comprises polycrystalline silicon and wherein the insulator comprises oxide.

8. The method of claim 1 further including forming a spacer on the active region and around the gate structure.

9. The method of claim 1 wherein providing the semiconductor on insulator substrate includes providing silicon for the semiconductor and oxide for the insulator.

10. The method according to claim 1, further including implanting a third dopant into the active region, wherein the third dopant penetrates the active region under the gate structure.

11. A method of manufacturing a semiconductor device, the method comprising: providing a substrate; isolating an active region on the substrate; forming a gate structure of a first height on the active region, wherein the gate structure comprises polycrystalline silicon on oxide; forming a spacer of a second height on the active region and around the gate structure; implanting a dopant into the active region, wherein the dopant is implanted with an implant dose and with an implant energy and wherein the dopant penetrates the active region under the gate structure and under the spacer by passing through the gate structure and through the spacer during implanting of the dopant; and annealing the dopant.

12. The method of claim 11 further including implanting the dopant with an implant energy of about 50 keV to 400 keV.

13. The method of claim 12 further including implanting the dopant with an implant dose of about $2 \times 10^{11}$ atoms/$cm^2$ to $8 \times 10^{13}$ atoms/$cm^2$.

14. The method of claim 13 further including implanting boron for the dopant.

15. The method of claim 13 further including implanting phosphorous for the dopant.

16. The method of claim 11 further including implanting the dopant through the spacer and the gate structure and into the active region wherein the first height of the gate structure is similar to the second height of the spacer during implanting of the dopant.

17. The method of claim 16 further including providing the first height of the gate structure as being a final height of the gate structure for the semiconductor device.

18. A method of manufacturing a low power, lateral semiconductor device with a channel of a first conductivity type, the method comprising: providing a silicon on insulator substrate; isolating an active region on the silicon on insulator substrate; forming a gate structure having a height on the active region, wherein the gate structure includes polycrystalline silicon and oxide; forming an oxide spacer having the height of the gate structure on the active region and around the gate structure; forming a patterned photoresist layer on the silicon on insulator substrate, wherein the patterned photoresist layer does not cover the active region; implanting a first dopant of the first conductivity type into the active region, wherein the gate structure blocks the first dopant from penetrating the active region under the gate structure during implanting of the first dopant, wherein the gate structure and the oxide spacer have the height during implanting of the first dopant, and wherein the first dopant does not pass through the patterned photoresist layer during implanting of the first dopant; implanting a second dopant of a second conductivity type into the active region, wherein the second dopant penetrates the active region under the gate structure by passing through the gate structure during implanting of the second dopant, wherein the gate structure and the oxide spacer have the height during implanting of the second dopant, wherein the second dopant does not pass through the patterned photoresist layer during implanting of the second dopant, and wherein the patterned photoresist layer used to block the first dopant is also used to block the second dopant; removing the patterned photoresist layer from the silicon on insulator substrate; and annealing the first dopant and the second dopant.

19. The method of claim 18 further including providing the height of the gate structure as being a final height of the gate structure of the low power, lateral semiconductor device.

20. A method of adjusting a threshold voltage for a semiconductor device, the method comprising:

providing a semiconductor substrate;

isolating an active region in the semiconductor substrate;

forming a gate structure over a portion of the active region;

forming a patterned photoresist layer over the semiconductor substrate while leaving the active region exposed;

implanting a first dopant into the active region, the gate structure preventing the first dopant from penetrating the active region under the gate structure during implanting of the first dopant, wherein the first dopant does not pass through the patterned photoresist layer during implanting of the first dopant;

implanting a second dopant into the active region, the second dopant penetrating the active region under the gate structure, wherein the second dopant does not pass through the patterned photoresist layer during implanting of the second dopant; and implanting a third dopant into the active region, the third dopant penetrating the active region under the gate structure, wherein the third dopant does not pass through the patterned photoresist layer during implanting of the third dopant.

* * * * *